(12) United States Patent
Forrest et al.

(10) Patent No.: US 11,539,031 B2
(45) Date of Patent: Dec. 27, 2022

(54) ENHANCED OLED OUTCOUPLING BY SUPPRESSING SURFACE PLASMON MODES

(71) Applicant: Regents of the University of Michigan, Ann Arbor, MI (US)

(72) Inventors: Stephen R. Forrest, Ann Arbor, MI (US); Yue Qu, Ann Arbor, MI (US)

(73) Assignee: REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 346 days.

(21) Appl. No.: 16/560,109

(22) Filed: Sep. 4, 2019

(65) Prior Publication Data

US 2020/0006708 A1 Jan. 2, 2020

Related U.S. Application Data

(62) Division of application No. 15/724,055, filed on Oct. 3, 2017, now abandoned.

(60) Provisional application No. 62/403,454, filed on Oct. 3, 2016, provisional application No. 62/403,490, filed on Oct. 3, 2016, provisional application No. 62/450,147, filed on Jan. 25, 2017.

(51) Int. Cl.
*H01L 51/52* (2006.01)
*H01L 51/50* (2006.01)

(52) U.S. Cl.
CPC ...... *H01L 51/5268* (2013.01); *H01L 51/5072* (2013.01); *H01L 51/5212* (2013.01); *H01L 51/504* (2013.01); *H01L 51/5265* (2013.01); *H01L 51/5271* (2013.01); *H01L 51/5275* (2013.01); *H01L 2251/5369* (2013.01); *H01L 2251/558* (2013.01)

(58) Field of Classification Search
CPC ............ H01L 51/5268; H01L 51/5072; H01L 51/5212; H01L 51/504; H01L 51/5265; H01L 51/5271; H01L 51/5275; H01L 2251/5369; H01L 2251/558
USPC ...................................................... 257/40, 59
See application file for complete search history.

(56) References Cited

U.S. PATENT DOCUMENTS

| | | | |
|---|---|---|---|
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 9,541,681 B2 | 1/2017 | Taima et al. | |

(Continued)

OTHER PUBLICATIONS

Gather, Malte C. et al., "Recent advances in light outcoupling from white organic light-emitting diodes" Journal of Photonics for Energy, vol. 5, Issue 1, May 7, 2015, pp. 1-21.

(Continued)

*Primary Examiner* — Thao X Le
*Assistant Examiner* — Eric W Jones
(74) *Attorney, Agent, or Firm* — Duane Morris LLP

(57) ABSTRACT

A number of new solutions for enhancing the extraction of waveguided mode and suppressing surface plasmon polariton mode in OLEDs are disclosed.

7 Claims, 20 Drawing Sheets

(56) References Cited

U.S. PATENT DOCUMENTS

| | | | |
|---|---|---|---|
| 9,761,842 | B2 | 9/2017 | Oskooi et al. |
| 2003/0164496 | A1 | 9/2003 | Do et al. |
| 2004/0183433 | A1 | 9/2004 | Cho et al. |
| 2009/0231702 | A1* | 9/2009 | Wu .................. G02B 5/3058 359/485.01 |
| 2012/0025245 | A1 | 2/2012 | Nakamura et al. |
| 2012/0074392 | A1 | 3/2012 | Huang et al. |
| 2012/0126219 | A1* | 5/2012 | Sato .................. H01L 51/5016 257/40 |
| 2012/0193645 | A1 | 8/2012 | Krummacher et al. |
| 2012/0234460 | A1* | 9/2012 | Zhang ................ H01L 51/5268 156/67 |
| 2013/0037843 | A1* | 2/2013 | Yamao ............... H01L 51/5012 257/98 |
| 2013/0186467 | A1 | 7/2013 | Saeki et al. |
| 2014/0332794 | A1 | 11/2014 | Birnstock et al. |
| 2015/0228931 | A1* | 8/2015 | Lamansky ......... H01L 51/5268 257/40 |
| 2016/0197306 | A1 | 7/2016 | Oskool et al. |
| 2016/0204387 | A1 | 7/2016 | Forrest et al. |
| 2016/0365541 | A1 | 12/2016 | Wehlus |

OTHER PUBLICATIONS

Fuchs, Cornelius et al., "Surface plasmon polariton modification in top-emitting organic light-emitting diodes for enhanced light outcoupling" Organic Light Emitting Materials and Devices XVIII. ed. / F. So. vol. 9183 SPIE, 2014. (Proceedings of SPIE; vol. 9183).

Schwab, Tobias et al., "Eliminating Micro-Cavity Effects in White Top-Emitting OLEDs by Ultra-Thin Metallic Top Electrodes" Adv. Optical Mater., Dec. 2013, pp. 1-5.

Ju, Young-Gu, "Micro-Cavity in Organic Light-Emitting Diode" Organic Light Emitting Diode—Material, Process and Devices, (InTech, 2011), pp. 275-290.

Park, Woo-Young et al., "Light outcoupling enhancement from top-emitting organic light-emitting diodes made on a nano-sized stochastic texture surface" Optics Express, vol. 22, Issue S7, pp. A1687-A1694 (2014).

Schwab, Tobias et al., "Improved Light Outcoupling and Mode Analysis of Top-Emitting OLEDs on Periodically Corrugated Substrates" Proc. SPIE 8829, Organic Light Emitting Materials and Devices XVII, 88291I (Sep. 27, 2013); doi: 10.1117/12.2023222; http://dx.doi.org/10.1117/12.2023222.

Qu, Yue et al., "Elimination of Plasmon Losses and Enhanced Light Extraction of Top-Emitting Organic Light-Emitting Devices Using a Reflective Subelectrode Grid" ACS Photonics 2017, 4, 363-368, Published: Jan. 12, 2017.

* cited by examiner

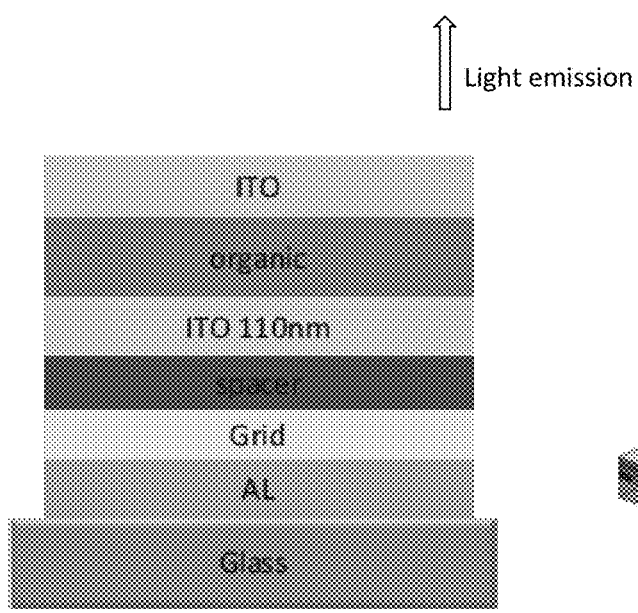
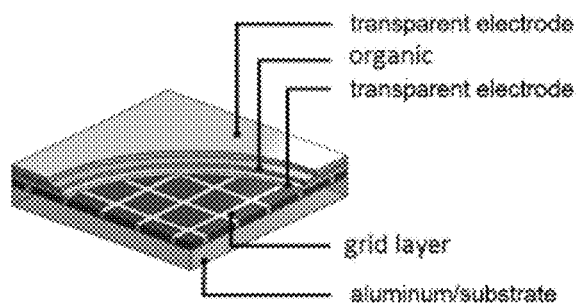
FIG. 10A                    FIG. 10B

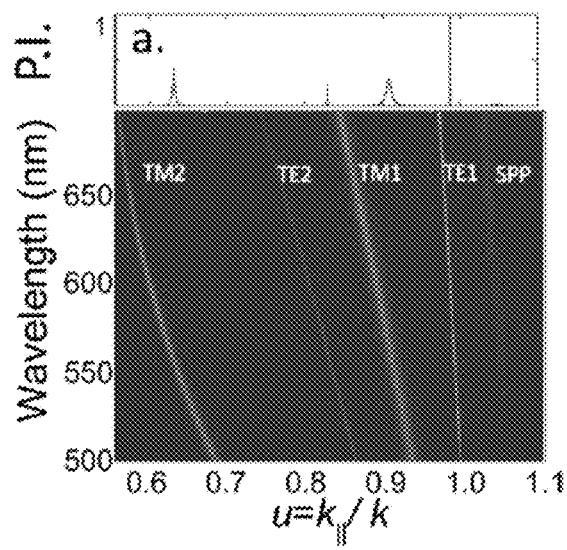 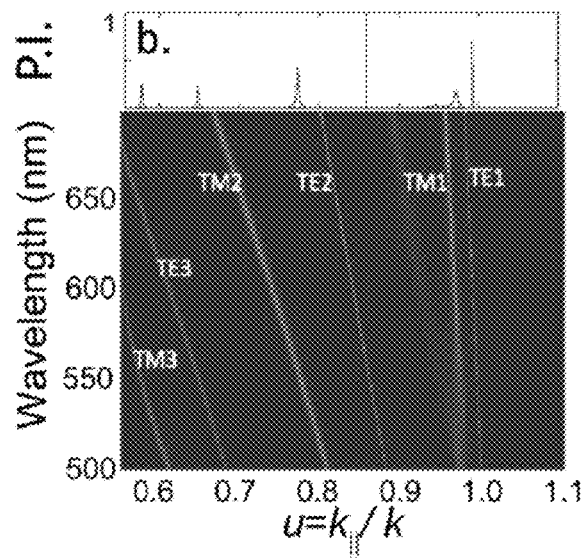
FIG. 17A  FIG. 17B
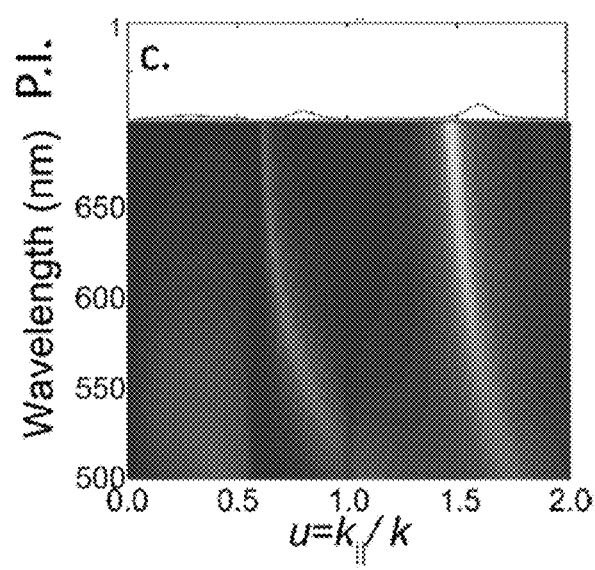
FIG. 17C

ENHANCED OLED OUTCOUPLING BY SUPPRESSING SURFACE PLASMON MODES

CROSS-REFERENCE TO RELATED APPLICATIONS

This application is a divisional application of U.S. application Ser. No. 15/724,055, filed on Oct. 3, 2017, claiming priority to U.S. Provisional Application Ser. No. 62/403,454, filed on Oct. 3, 2016, U.S. Provisional Application Ser. No. 62/403,490, filed on Oct. 3, 2016, and U.S. Provisional Application Ser. No. 62/450,147, filed on Jan. 25, 2017, the entire contents of which are incorporated herein by reference.

GOVERNMENT RIGHTS

This invention was made with government support under Award No. DMR-1411064 awarded by NSF and Award No. DE-EE0007626 awarded by Office of Energy Efficiency and Renewable Energy (EERE) and United States Department of Energy. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and Universal Display Corporation. The agreement was in effect on and before the effective filing date of the presently claimed invention, and the claimed invention was made as a result of activities undertaken within the scope of the agreement.

FIELD

The present invention relates to methods of enhancing outcoupling in organic light emitting devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

FIG. 1 is a representation of an organic light emitting device (OLED) 100 in which each stated component is not drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over," "provided over," or "deposited over" a second layer, the first layer is disposed further away from substrate. There may be other layers between the first and second layer, unless it is specified that the first layer is "in contact with," "disposed on," "provided on," or "deposited on" the second layer. For example, a cathode may be described as "disposed over" an anode, even though there are various organic layers in between.

As used herein "bottom-emitting OLED" refers to an OLED in which the light emitting from the emissive region (a.k.a. the active region) of the OLED stack exits the OLED stack through the glass substrate. In comparison, "top-emitting OLED" refers to an OLED in which the light emitting from the emissive region of the OLED stack exits the OLED stack in the direction away from the glass substrate, generally through the cathode layer.

The total external quantum efficiency (EQE), which is the product of the internal quantum efficiency (IQE) and the outcoupling efficiency ($\eta_{out}$), is regarded as one of the critical device parameters because it directly describes the amount of emitted photons per consumed electrical energy. The inherent layered structure of OLEDs causes a low outcoupling efficiency since generated photons become trapped in waveguided modes and are wasted in the excitation of surface plasmon polaritons (SPPs). The major loss channels for trapped light (beyond the modes trapped in the substrate (i.e., glass mode)) are waveguide and SPPs. Waveguide modes propagate tens of micrometers and can be efficiently scattered out of the device with appropriate outcoupling structures. In contrast, SPP modes are excited primarily in the metal cathode, propagate only a few micrometers, and dissipate before scattering. Thus, improving the extraction of waveguided modes and preventing SPPs are desired to enhance the external quantum efficiency of OLEDs.

SUMMARY

An OLED is disclosed which comprises a transparent substrate having a first side and a second side, a transparent organic light scattering layer disposed over the first side of the substrate, wherein the organic light scattering layer is a continuous layer having a randomly corrugated surface texture with surface texture height between 5 nm-10 μm with a lateral feature size of 100-1000 nm. The OLED includes an emissive region disposed on the organic light scattering layer, the emissive region comprising a transparent anode, a cathode, and at least one organic emissive layer between the transparent anode and the cathode. The transparent anode, the organic emissive layer, and the cathode each have a randomly corrugated structure produced by the randomly corrugated surface texture of the underlying transparent organic light scattering layer and the randomly corrugated structure in the emissive region extracts waveguided mode.

An OLED is disclosed which comprises a transparent substrate having a first side and a second side, an emissive region disposed over the first side of the transparent substrate. The emissive region comprises a transparent first electrode disposed over the transparent substrate, at least one organic emissive layer disposed over the transparent first electrode; and a transparent second electrode disposed over the at least one organic emissive layer, an optical grating layer having a grating structure having a sub-wavelength periodicity disposed on the transparent second electrode, and a reflective layer disposed over the optical grating layer.

A TEOLED is disclosed which comprises a substrate having a first side and a second side, a reflective layer disposed over the first side of the substrate, a grid layer consisting of two optically transparent materials with different refractive indices disposed on the reflective layer, a transparent first electrode provided over the grid layer, an organic emissive layer provided over the transparent bottom electrode, and a transparent second electrode provided over the organic emissive layer, wherein the grid layer scatters trapped waveguided modes from the organic emissive layer.

BRIEF DESCRIPTION OF THE DRAWINGS

FIGS. 10A and 10B are illustrations of an TEOLED configured for extracting light trapped in the organic and ITO layers using a patterned grid placed between a substrate and an electrode.

FIGS. 17A, 17B, and 17C are color maps showing modal power distributions within the cavities. Here, u is the in-plane component of the wavevector, $k_{\parallel}$, for light propagating within the organic layers with a refractive index of $n_{org}$, normalized to the wavevector k itself. The waveguide modes, and SPP modes at $u>n_{air}/n_{org}$, of the cavities over the grid lines is shown in FIG. 17A. The waveguide modes, and SPP modes at $u>n_{air}/n_{org}$, of the cavities over the depression is shown in FIG. 17B. The power distribution of a conventional TEOLED optimized over the same spectral range, with the structure Ag/90 nm organic layers/20-nm-thick top Ag layer, with a 20 nm thick EML centered in the organic active region is shown in FIG. 17C. The plots above each color map are the power distributions at a wavelength of λ=540 nm.

DETAILED DESCRIPTION

Figure 1:
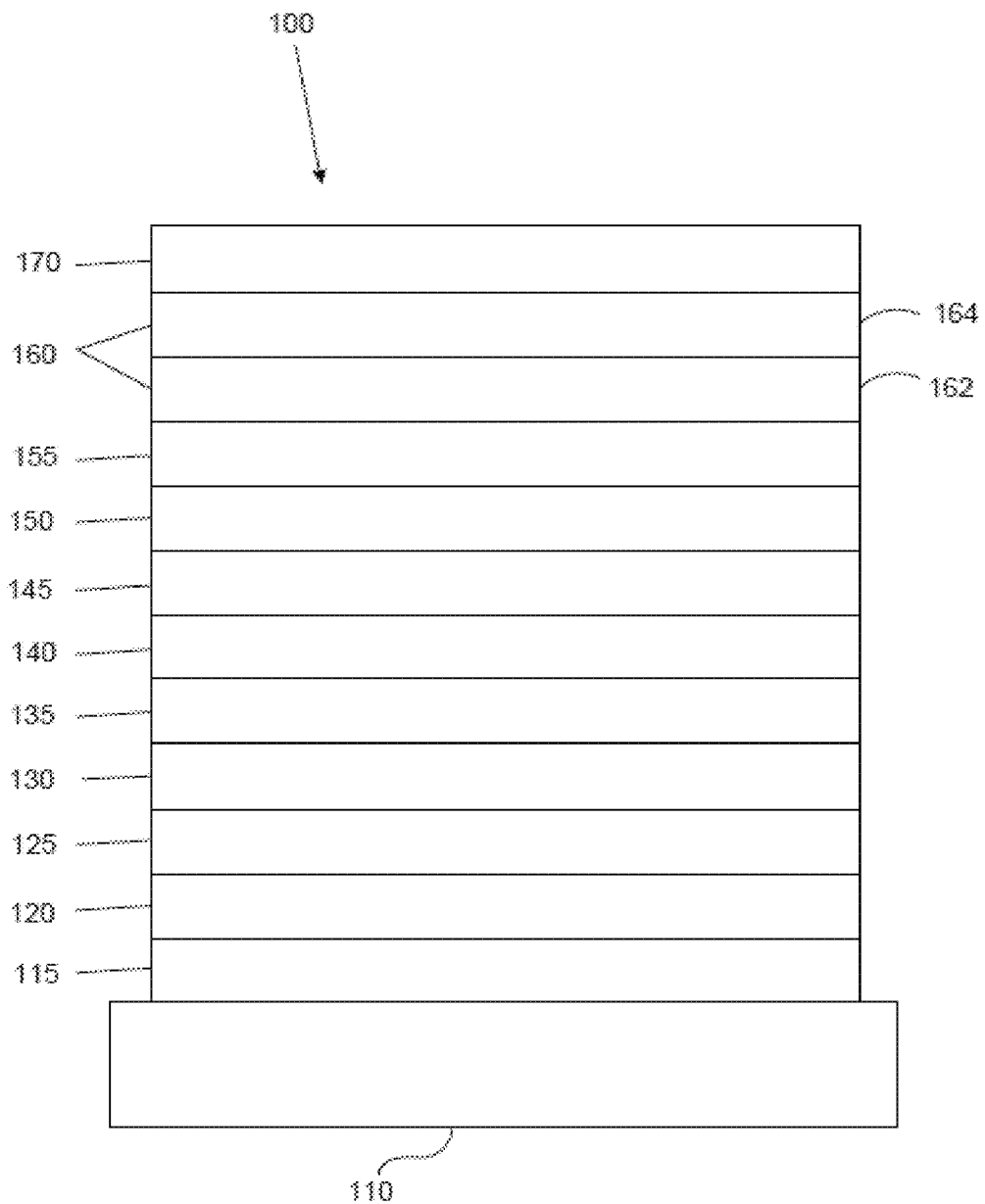
FIG. 1 shows an organic light emitting device.
Figure 2:
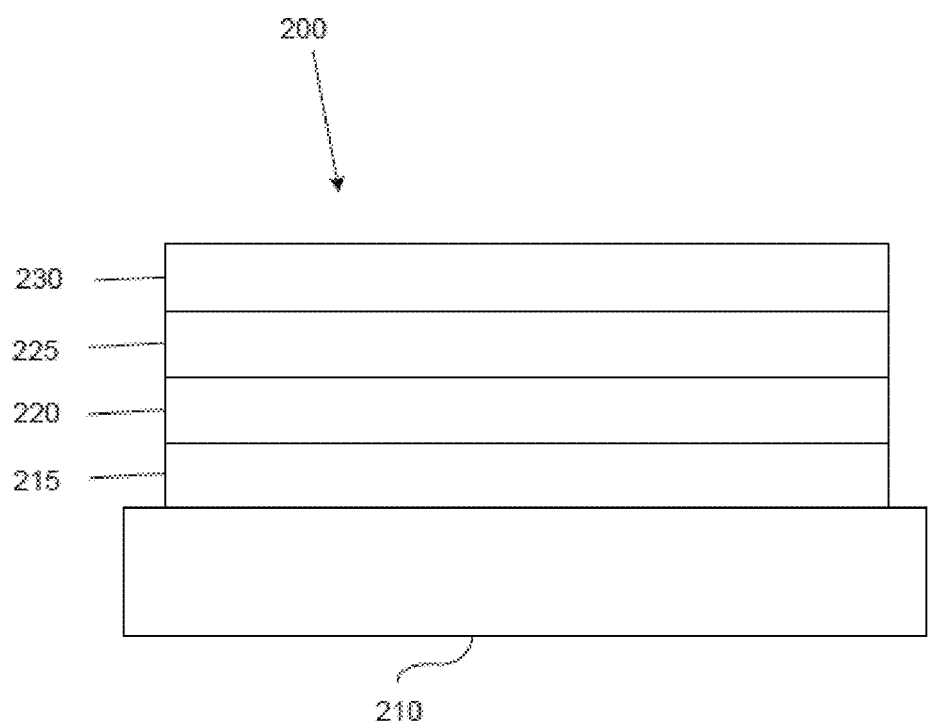
FIG. 2 shows an inverted organic light emitting device that does not have a separate electron transport layer.

The OLED structures of interest can deviate from the common layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Applicant describes a number of solutions for enhancing the extraction of waveguided mode and suppressing SPP mode in OLEDs are disclosed. In one embodiment, a sub-anode grid with thick electron transport layer (ETL) is utilized. In another embodiment, a corrugated textured (i.e. rough) transparent organic layer is introduced between the anode and the glass substrate. The corrugation is random and has a low profile. In a third embodiment, a planarized optical grating is provided between the anode and the glass substrate coupled with an optical diffuser at the substrate-air interface. Moreover, any one or more of the above respective embodiments can be used in combination. Also, any one, or combination, of the described embodiments can be coupled with a substrate light extraction strategy, such as microlens array, to achieve external quantum efficiency greater than 70%.

In theory, electrophosphorescent organic light emitting devices (PHOLEDs) can yield 100% internal quantum efficiency (IQE). However, even in such an instance, one at best can hope to achieve an external quantum efficiency of EQE~20% on conventional glass substrates in the absence of an outcoupling strategy. Much of the generated light remains trapped within the substrate due to total internal reflection at the glass-air interface, trapped within the organic material layers and the transparent anode due to their high refractive indices compared to glass, and/or dissipates at the organic/cathode interface by exciting SPPs. The optical power trapped inside the active region excites two different modes: the waveguide mode (power guided within the organic layer and transparent anode), and SPPs consisting of power confined at the metal/organic interface. The waveguide mode propagates tens of microns before dissipation, whereas SPPs can survive only microns.

Figure 3A:
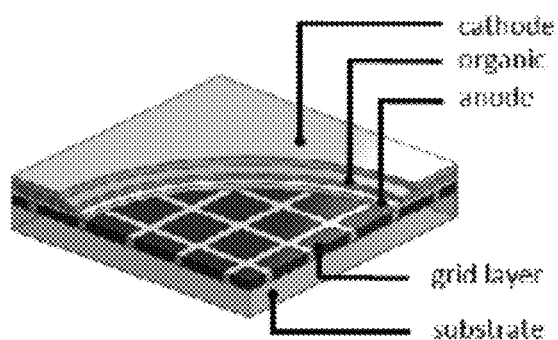
FIG. 3A shows the structure of a sub-anode grid.

To account for some of the internal reflection at the glass substrate-air interface, microlens arrays can be used. The arrays outcouple the majority of substrate mode photons, but have no effect on optical power confined within the high-index organic and anode regions (waveguide modes), or at the metal/organic interface (SPPs). The waveguided light can be extracted by inserting a planar grid layer consisting of two transparent materials with different refractive indices between the indium tin oxide (ITO) anode and glass substrate (called a sub-anode grid, see FIG. 3A). Outcoupling by this grid (whose spacing is significantly greater than the wavelength of interest) has minimal impact on wavelength and viewing angle. Also, by positioning the grid external from or outside of the OLED's active region, the approach allows for complete freedom in varying its dimensions and materials without impacting the optical and electrical characteristics of the OLED. Hence, both the grid and the OLED can be independently optimized, separate from an optimized organic device structure to deliver optimal external quantum efficiencies.

Figure 3B:
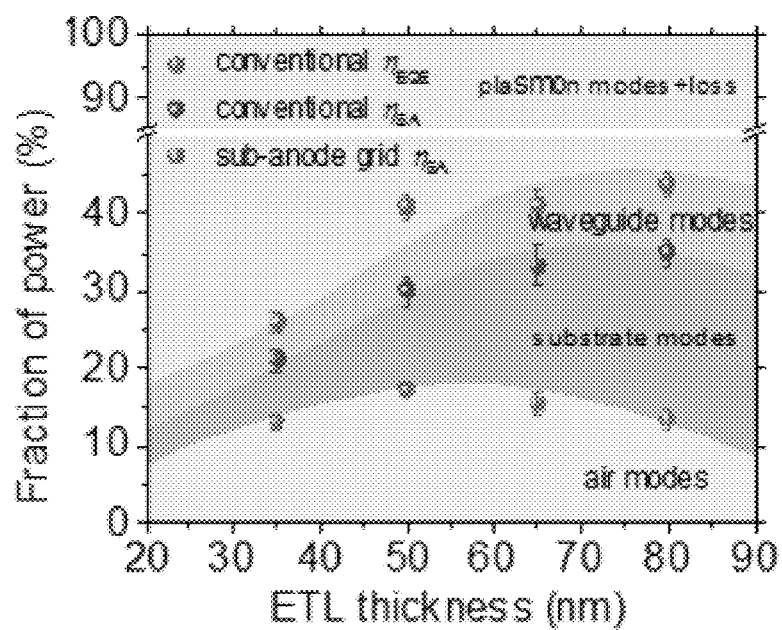
FIG. 3B shows the fraction of power (at 550 nm) vs. ETL thickness, along with measured performance of the sub-anode grid; the upper (grey) portion corresponds to fraction of light coupled into SPPs.

However, as indicated in FIG. 3B, a large fraction of the light (~40%) still remains lost to surface plasmons. Disclosed herein are Applicant's solutions for extracting light from OLEDs by means that are non-intrusive to the active OLED structure. The solutions involve making of a substrate for front plane organic film deposition, and the solutions are wavelength and/or viewing angle independent. By combining sub-anode SPP extraction solution disclosed herein with microlens arrays to diffuse and outcouple all of the glass modes, up to 80% of the total light generated in the active OLED emission region can be extracted providing the needed increase in OLED efficiency.

Figure 4:
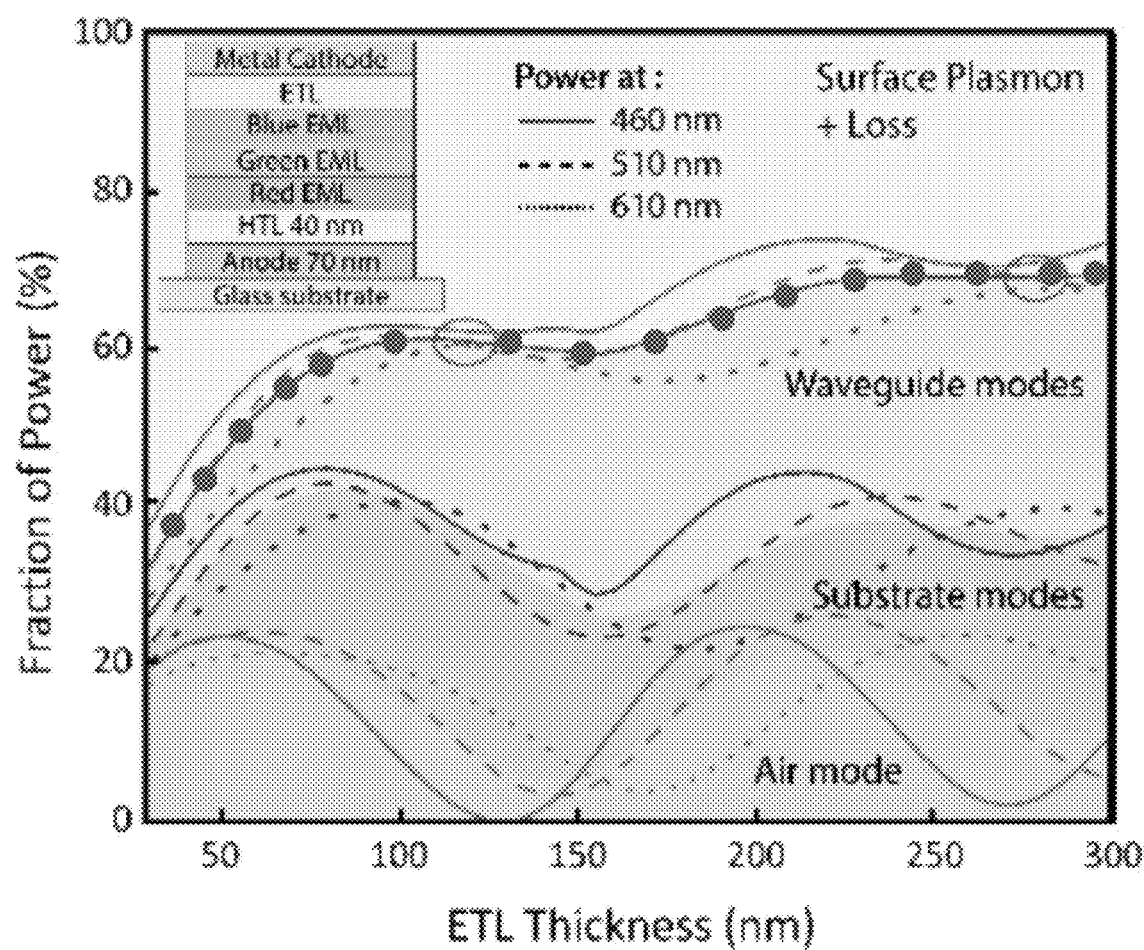
FIG. 4 shows a modal analysis of a WOLED. The solid dashed and dotted lines correspond to the power distribution of spectral peaks at wavelengths of 460 nm, 510 nm and 610 nm. The shaded areas show the optical total WOLED power distribution according to the ration of B:G:R=0.25:0.3:0.45. The brown circles show the white spectrum due to comparable light extraction efficiencies of the three colors.

FIG. 4 shows the calculated optical power distribution (assuming IQE=100%) inside a white organic light emitting diode (WOLED) as a function of ETL thickness. In this example WOLED, the color rendering index (CRI) is equal to 91 and correlated color temperature (CCT) is equal to 3100K based on the emission of known Blue, Green, and Red iridium or platinum phosphorescent emitters used in OLED displays and lighting. The lines correspond to the power distribution of each spectral peak at wavelengths of 460 nm (solid), 510 nm (dashed), 610 nm (dotted). The shaded areas show the optical total WOLED power distribution according to the ratio of B:G:R=0.25:0.3:0.45. The different area shows the different modes of the device. The circles show the white spectrum due to comparable light extraction efficiencies of the three colors. The inset shows the structure of the WOLED. The modal power distributions vary for the different wavelengths, especially for air and substrate modes. The sub-anode grid is capable of extracting all optical power but SPPs (dotted line in FIG. 4) without distortion of the original spectrum of the emitters. In fact, one can achieve a light extraction efficiency of ~70% or more. As the dotted line in FIG. 4 demonstrates, a good white color balance and high light extraction efficiency is attainable at electron transport layer (ETL) thicknesses of 130 nm or 260 nm, where the efficiency of each phosphor is comparable. As disclosed herein, the SPPs can be decoupled by using thick, conductivity-doped ETLs to achieve high luminance efficiency even at ETL thicknesses approaching 260 nm. The preferred ETL thickness is at least 30 nm. In other embodiments, the ETL can have a thickness of at least 50 nm, 75 nm, 100 nm, 125 nm, 150 nm, 175 nm, or at least 200 nm and no more than 400 nm. Organic dopants such as Li-quinoline (Liq) and Li doped into Alq3 are both known for reducing layer resistance. The thick ETL is shown to be helpful in reducing shorts, and hence increasing device yield for large area PHOLEDs.

[Random Corrugated Texture]

According to another aspect of the present disclosure, a bottom-emitting OLED is disclosed which comprises a transparent substrate having a first side and a second side, a transparent organic light scattering layer disposed over the first side of the substrate, wherein the organic light scattering layer is a continuous layer having a randomly corrugated surface texture with surface texture height between 5 nm-10 µm with a lateral feature size of 100-1000 nm. The OLED includes an emissive region disposed on the organic light scattering layer, the emissive region comprising a transparent anode, a cathode, and at least one organic emissive layer between the transparent anode and the cathode, wherein the transparent anode, the organic emissive layer, and the cathode each have a randomly corrugated structure stemming from the randomly corrugated surface texture of the underlying transparent organic light scattering layer. The randomly corrugated structure in the emissive region extracts waveguided mode.

Figure 5A:
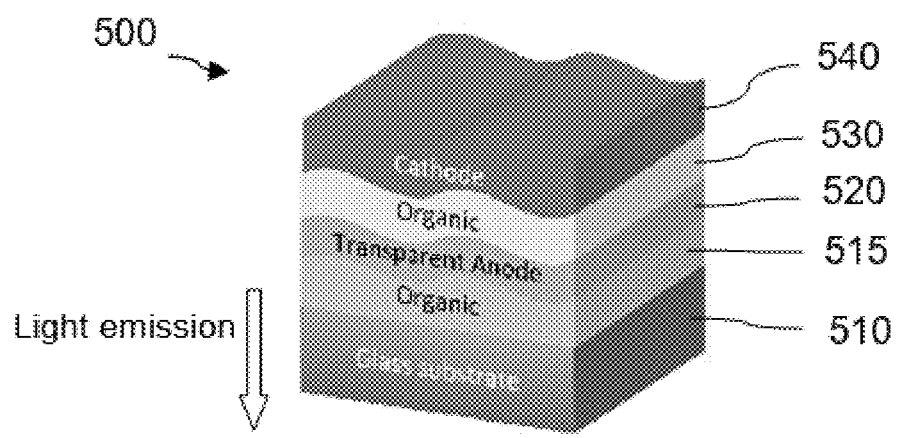
FIG. 5A shows a schematic of WOLED with organic scattering layer.

An example of such bottom-emitting OLEDs incorporating a random but very low profile corrugated textured organic layer is introduced in a sub-anode position is illustrated in FIG. 5A. FIG. 5A shows a schematic illustration of such a bottom-emitting OLED structure 500. The OLED structure 500 comprises a glass substrate 510 and an OLED active region comprising a transparent anode 520, organic emissive layer 530, and a metal cathode 540. An organic light scattering layer 515 having a randomly corrugated surface texture is provided on the glass substrate 510 between the transparent anode 520 and the substrate 510. The random corrugation on the organic light scattering layer 515 is formed by randomly arranged surface features produced by the deposition process for the organic light scattering layer 515.

The corrugated texture of this sub-anode organic light scattering layer 515 is replicated in the subsequently deposited active region layers 520, 530, 540 thus introducing roughness to the layer interfaces. This texture does not change the photon state density in the active region and, thus, the emission spectrum is not distorted, and the power distribution is comparable to a conventional device (cf. FIG. 4). The resulting active region, together with the randomly corrugated organic light scattering layer 515 form a waveguide structure. The generated photons trapped in the waveguided mode will be extracted out of the active region by the bends and the structural interruptions at the layer interfaces produced by the random corrugation texture in the waveguide structure. Corrugations at the metal cathode surface scatter the power in the waveguide mode as well as prevent coupling to SPPs. Furthermore, light trapped in the glass substrate (glass modes) also will be extracted by the corrugated surface and reflected back by the metal cathode surface acting as a mirror, to further improve light extraction as well. By incorporating the random corrugation in the active region, inventors believe that light extraction efficiency can be improved to greater than 70%.

The dimensional size of the random corrugation features can be important. If the corrugation feature size is too large, it will introduce diode leakage current. If the corrugation feature size is too small, it will not efficiently extract light. The height of the surface texture of the randomly corrugated organic light scattering layer 515 is between 5 nm-10 µm with a lateral feature size of 100-1000 nm. Preferably, the surface texture height is between 5-500 nm. More preferably, the surface texture height is between 5-300 nm. Most preferably the surface texture height is 10 nm. Preferably, the lateral feature size of the randomly corrugated surface texture is approximately 400 nm.

Interestingly, Applicant learned that unlike periodic structures, the randomly corrugated structure of the present disclosure do not have wavelength dependency nor angle dependency. Therefore, the lateral feature size of the corrugation can be small to outcouple the trapped light by scattering before the light unretrievably dissipates.

Figure 5B:
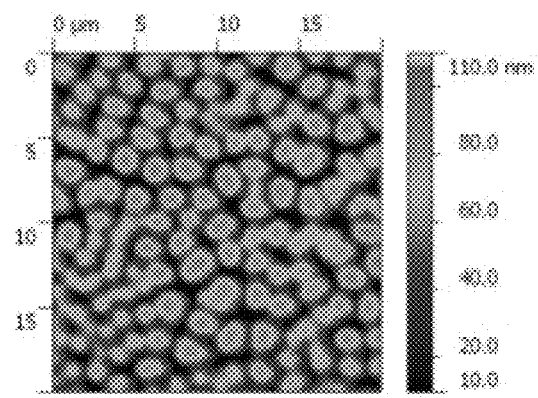
FIG. 5B shows a laser interference microscopic image of rubene deposited using OPVD at 0.5 nm/s at 0.1 Torr.
Figure 5C:
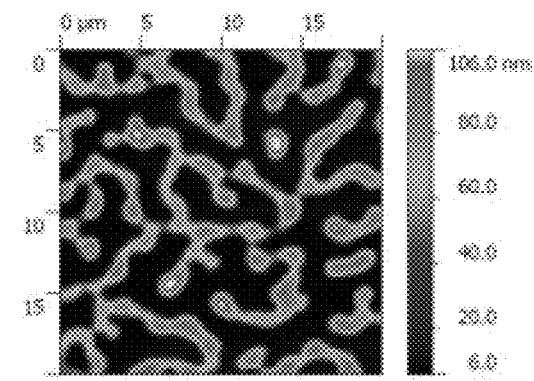
FIG. 5C shows a laser interference microscopic image of rubene deposited using OPVD at 0.5 nm/s at 10 Torr.

Two fabrication methods are described for depositing the randomly corrugated organic light scattering layer 515 on the glass substrate prior to ITO transparent anode 520 sputter deposition using organic vapor phase deposition (OVPD). FIGS. 5B and 5C show the example growth of rubrene nano-pillars in the sub-ITO region where the features are controlled by deposition conditions. Rubrene was used here to illustrate that OVPD process can be used to deposit small molecule organic film having randomly corrugated surface texture. Some organic material candidates that are UV absorbing and do not absorb visible light spectrum that can be used for the random corrugated organic light scattering layer 515 are examples such as NPD and many hole conductors that can easily also tolerate subsequent deposition of ITO. Another example method for depositing the randomly corrugated organic light scattering layer 515 is spin-coating a thin film of the organic material on the glass substrate and then stamped with a mold, cured together with a "strain-buckled" mold and then peeled off the mold. The mold fabrication is as follows: a thin Ag film (~10 nm) is first deposited and then baked. Due to differences in surface energies, the Ag film spontaneously forms randomly arranged islands. Then another thin glass film is deposited over the Ag islands thus creating a mold with the glass film. This glass film mold is used to stamp the spin-coated organic film replicating the randomly distributed Ag islands. Since the texture height is on the order of 10 nm with lateral feature size of several 100 nm, the aspect ratio of the texture is small ~0.1, which is quite easy to form.

[Optical Grating+Mirror Provided on Topside of an OLED in a BEOLED]

A bottom-emitting OLED is disclosed which comprises a transparent substrate having a first side and a second side, an emissive region disposed over the first side of the transparent substrate. The emissive region comprises a transparent first electrode disposed over the transparent substrate, at least one organic emissive layer disposed over the transparent first electrode; and a transparent second electrode disposed over the at least one organic emissive layer, an optical grating layer having a grating structure having a sub-wavelength periodicity disposed on the transparent second electrode, and a reflective layer disposed over the optical grating layer.

Optical band gap structures or optical grating structure embedded near or inside the bottom-emitting OLED active region inhibit SPPs and enhance extraction of photons from waveguided mode. The optical grating structure is non-perturbative (i.e., does not introduce rough texture or corrugation to the OLED stack) and has a periodic structure with nanoscale periods. Although the provision of the optical grating structure within the OLED stack near or inside the OLED's active region introduces pronounced sensitivity to wavelength and angular emission, the sensitivity can be completely eliminated by using an external diffuser structures at the glass-air interface. The optical gratings near the active regions then scatter and extract light from waveguided mode into the glass substrate, ultimately resulting in the desired Lambertian angular emission profile. The enhancement achieved by the optical grating is attributed to a fundamentally different effect from the described sub-anode grid structure and the corrugated OLED stack structure because the optical grating prevents the generated photons from exciting SPPs to begin with. The optical grating proximal to the OLED active region eliminates the waveguided mode and SPP modes, yet enhancing optical power directed into the substrate, thereby eliminating all but intrinsic absorption losses. A feature size of approximately 300 nm is needed to direct the waveguided modes into the light cone of the air mode to achieve an efficiency greater than 70%. The height of the grating structure is approximately 10 nm, resulting in a minimal perturbation of the OLED structure.

Figure 6:
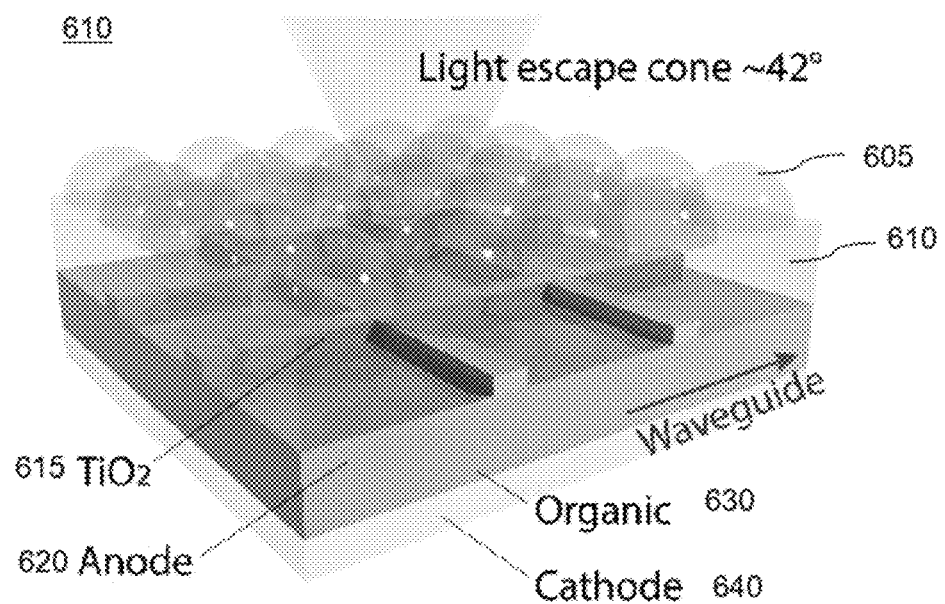
FIG. 6 shows a complete WOLED showing sub-anode 2D TiO2 grid for outcoupling waveguide and SPP modes, glass substrate (faintly shaded), and diffusing microlens array.

An example of such OLED incorporating an optical grating and a reflective layer (a mirror) provided on the topside of a bottom-emitting OLED is illustrated in FIG. 6. In the embodiment shown in FIG. 6, the sub-anode optical grating 615 (unlike the grid in FIG. 3) is provided buried into or fabricated directly into the glass substrate at the glass substrate-anode interface. The optical grating 615 can be fabricated directly into the glass substrate 610 by interference lithography. A layer of photoresist is deposited over the glass substrate 610 then patterned with recesses representing the grating pattern 615 via interference lithography. The glass substrate 610 is then etched through the patterned recesses in the photoresist. Then a transparent semiconductor material such as $TiO_2$ is blanket deposited over the substrate filling the etched pattern of recesses in the glass substrate 610. The photoresist and the excess $TiO_2$ is removed in a liftoff step then the glass substrate 610 is planarized and polished leaving behind a surface in which the optical grating is patterned with $TiO_2$. Next, the transparent ITO anode 620 and organic layers of the active region 630 are deposited onto the glass substrate with the embedded optical grating 615. The cathode 640 is then deposited onto the active region 630. A diffuser such as microlens array 605 can be incorporated at the glass substrate-air interface to achieve wavelength independence and to extract light from glass mode.

Figure 7:
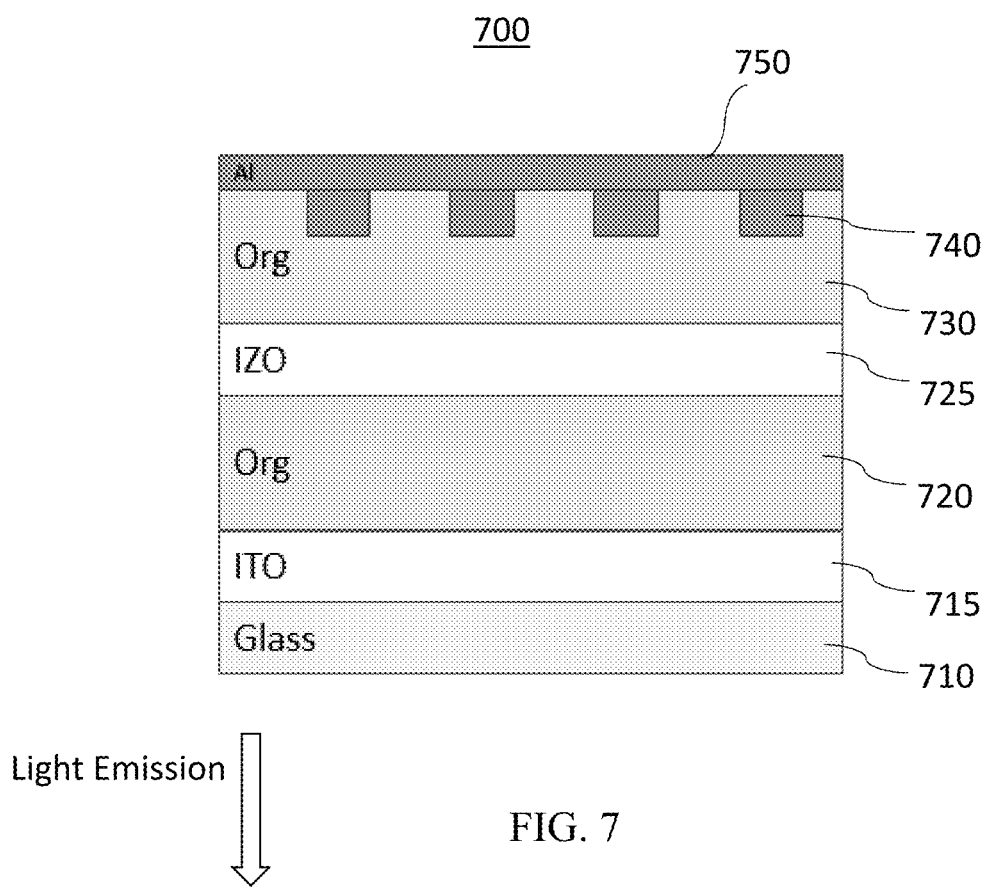
FIG. 7 is a schematic illustration of a bottom-emitting OLED stack 700 that is provided with a shallow, non-perturbative periodic nanoscale optical grating structure according to the present disclosure.

Referring to FIG. 7, in another embodiment, the shallow, non-perturbative periodic nanoscale optical grating structure 740 is provided in proximity of the active region but on the side opposite from the glass substrate in the bottom-emitting OLED 700. The nanoscale optical grating structure 740 is provided in combination with a metal mirror to reflect and redirect the stray light extracted from the waveguided mode toward the bottom side (i.e. the glass substrate side) of the OLED stack 700. The OLED stack 700 comprises a glass substrate 710. An emissive region provided above the glass substrate where the emissive region comprises a first electrode (ITO) layer 715 and a second electrode (IZO) layer 725, and an organic emissive layer 720 disposed between the two electrode layers. Provided over the second electrode (indium zinc oxide (IZO)) layer 725 is an organic layer 730. Formed on top of the organic layer 730 is the shallow, non-perturbative periodic nanoscale optical grating structure 740 and the metal mirror layer 750. In addition to the optical grating 740 extracting the waveguided mode, the metal mirror layer 750 also prevents SPPs.

The optical grating 740 and the mirror layer 750 can be formed from the typical cathode material such as Al and Ag metal. Other reflective metal can be used for the mirror layer. The optical grating 740 has subwavelength grating periodicity. The periodicity of the grating needs to be subwavelength to cause optical interference.

Figure 8:
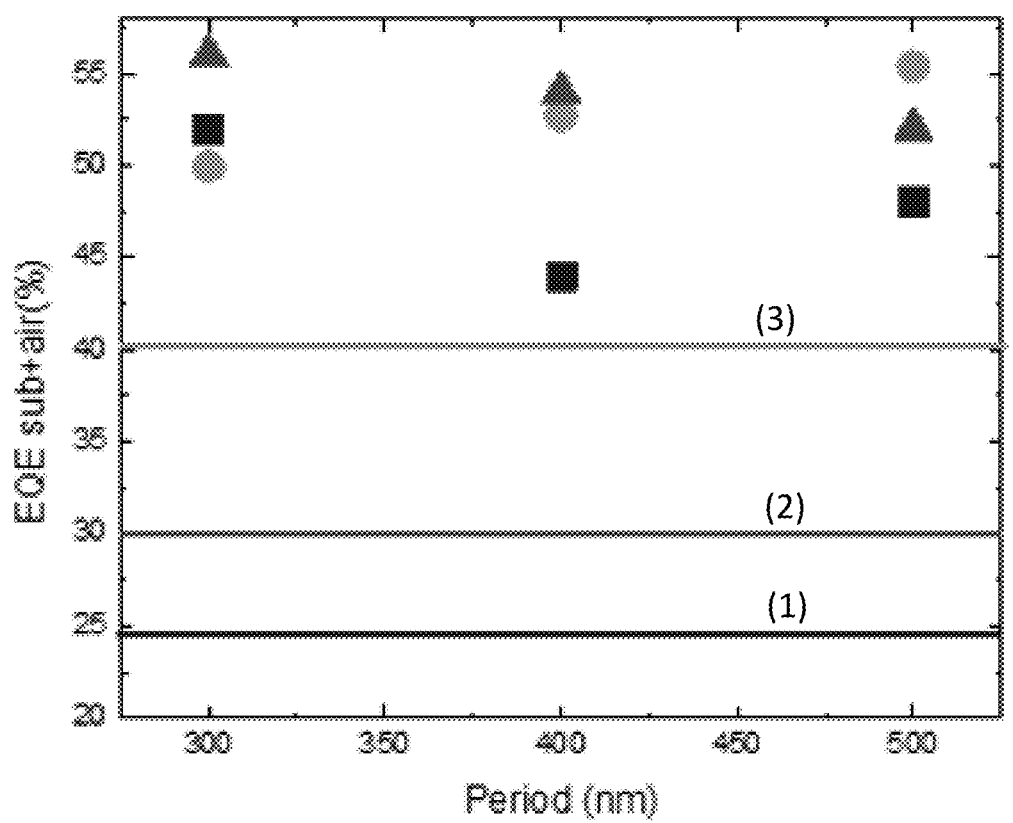
FIG. 8 shows simulation data comparing the EQE of the bottom-emitting OLED structure 700 of FIG. 7 against the EQE of a control device that has the same OLED stack layers without the optical grating structure.

FIG. 8 shows simulation data (using COMSOL Multiphysics software) comparing the EQE of the bottom-emitting OLED structure 700 against the EQE of a control device which had the same OLED stack structure as the structure 700 but without the optical grating 740. The devices were cavity tuned for green emission and the simulation was run for emission wavelengths of 460 nm, 510 nm, and 600 nm. The solid lines (1), (2), and (3) represent the EQE of the control device at the emission wavelengths 460 nm, 510 nm, and 600 nm, respectively. The EQE of the OLED structure 700 at the same emission wavelengths are shown by the data points represented by ■ for 460 nm, ▲ for 510 nm, and ● for 600 nm. The EQE data for the OLED structure 700 was generated for optical grating period of 300 nm, 400 nm, and 500 nm. The data shows substantial increase in EQE for the OLED structure 700. The data also shows that the grating period can be used to optimize different emission wavelengths. The emission wavelength of 460 nm exhibited the highest EQE at the grating period of 300 nm. The emission wavelength of 510 nm also exhibited the highest EQE at the grating period of 300 nm. The emission wavelength of 600 nm exhibited the highest EQE at the grating period of 500 nm.

In the simulation, the OLED stack had the following layers: the substrate/100 nm of ITO/190 nm of the emissive organic layer/50 nm of ITO/200 nm of organic layer/Al for the optical grating and mirror. The depth (or height) of the optical grating structure 740 into the 200 nm thick organic layer 730 was 120 nm.

Figure 9:
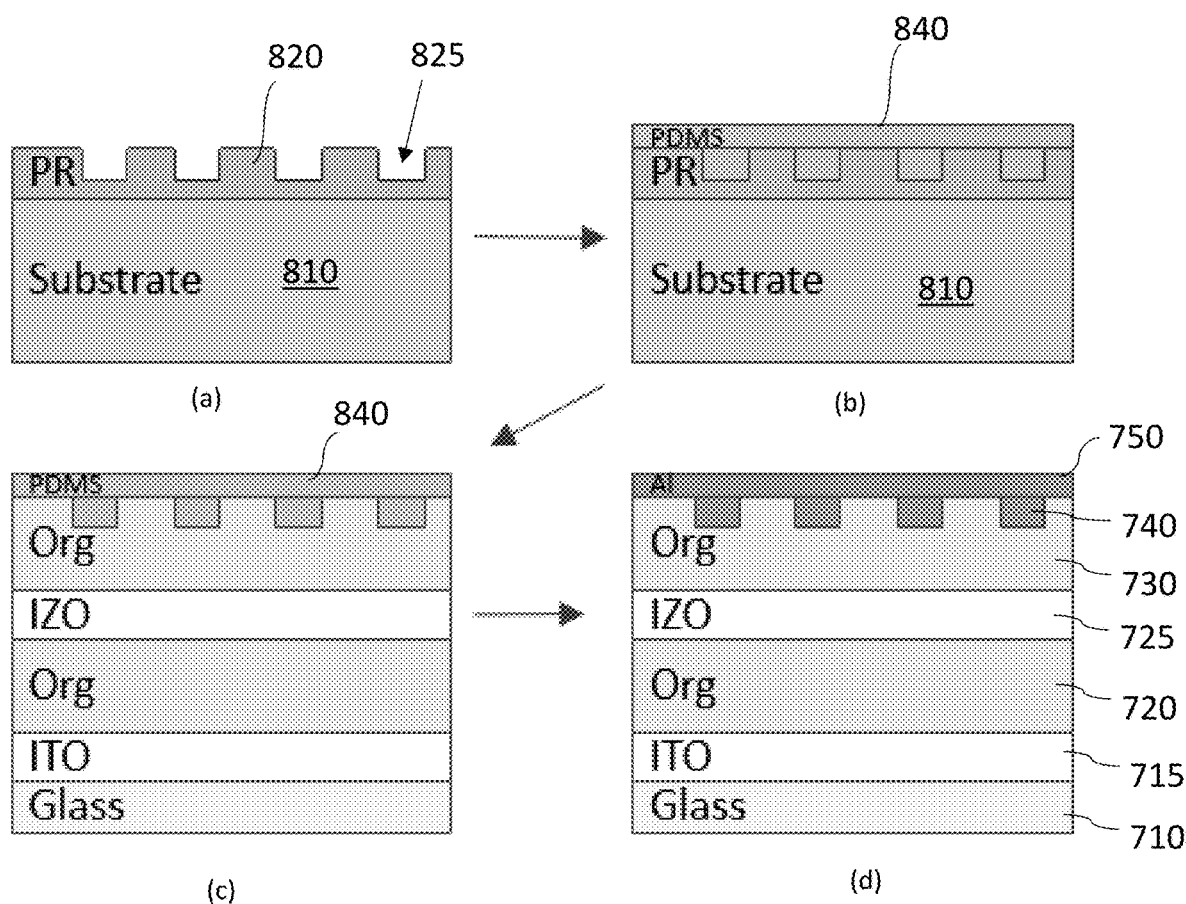
FIG. 9 shows the sequence of fabricating PDMS flexible mold for stamping the optical grating structure onto an organic layer in the OLED stack.

According to an aspect of the present disclosure, FIG. 9 shows an example of the method for fabricating the optical grating structure 740 that utilizes flexible polydimethylsiloxane (PDMS) mold to stamp the optical grating structure 740 directly onto the organic layer 730. First, a layer of photoresist 915 is deposited on a temporary substrate 910 and patterned to create recesses 920 having the desired optical grating pattern. (See FIG. 9, step (a)). Next, a layer of PDMS 925 is deposited over the photoresist 915 filling the optical grating pattern recesses 920. (See FIG. 9, step (b)). Thus, the PDMS forms a mold 925 for the optical grating pattern. Next, the PDMS mold 925 is removed from the temporary substrate 910 via a photoresist liftoff process and the PDMS mold 925 is used to stamp the optical grating structure pattern directly onto the organic layer 730. (See FIG. 9, step (c)). Next, a metal such as Al used for cathodes is deposited over the patterned organic layer 730 to form the optical grating structure 740 and the metal mirror layer 750 resulting in the OLED stack 700. (See FIG. 9, step (d)). The Using the methods just described, the optical gratings with a feature size in the order of 300 nm can be readily fabricated.

[Patterned Grid+Mirror in a TEOLED]

A TEOLED is disclosed which comprises a substrate having a first side and a second side, a reflective layer disposed over the first side of the substrate, a grid layer consisting of two optically transparent materials with different refractive indices disposed on the reflective layer, a transparent first electrode provided over the grid layer, an organic emissive layer provided over the transparent bottom electrode, and a transparent second electrode provided over the organic emissive layer, wherein the grid layer scatters trapped waveguided modes from the organic emissive layer.

An example of such TEOLEDs configured for extracting light trapped in the organic and ITO layers using a patterned grid placed between a substrate and an electrode is illustrated in FIGS. 10A and 10B. In a conventional TEOLED architecture, light is produced within the organic layers (the emissive region) and is emitted through the transparent electrode (mostly thin metal films) into the air away from the carrier substrate. Because of the high refractive index of the organic layers, a large portion of the produced light is trapped in so-called waveguide modes which reside mainly in these layers. The waveguide mode light travels parallel to the layer and is eventually lost to material absorption. By coupling this light out of the device one can significantly enhance efficiency and operational lifetime of the OLED.

Spectral narrowing and a pronounced angular dependence of the emission characteristics result in reduced efficiency and color quality for white TEOLEDs, compared to their bottom-emitting counterparts. Typical methods of enhancing efficiency of TEOLEDs include using microcavity effect, through the use of silver electrode or capping layer, for example, and introducing a rough layer right next to the emissive region. However, using microcavity effect can only enhance efficiency by limited amount, leaving >30% optical power generated in the organic layers. Until now, no effective ways to extract these fraction of light were known.

A grid consisting of two optically transparent materials having different refraction index can be used to extract the waveguided optical power in TEOLEDs. Instead of using silver or aluminum as bottom-side electrode, the typical cathode material silver or aluminum is used only as a mirror and ITO or other transparent conductor is used as the bottom-side electrode. Such TEOLED stack 1000 is shown in FIG. 10A. The TEOLED stack is formed on a glass carrier substrate 1010. The active emissive region is comprised of a transparent first electrode (e.g. ITO, IZO, etc.) 1030 and a transparent second electrode (e.g. ITO, IZO, etc.) 1050 with an emissive organic layer 1040 provided between the two electrode layers. A metal mirror (e.g. Al or Ag film) 1015 is provided on the glass substrate 1010. A grid 1020 consisting of two optically transparent materials with different refractive indices is positioned between the metal mirror 1015 and the transparent bottom electrode 1030. In a typical TEOLED stack, the top electrode 1050 is a cathode and the bottom electrode 1030 is an anode. Thus, the grid 1020 can be referred to as a sub-electrode grid. The grid 1020 is constructed of two optically transparent materials having different refractive index where the materials for the grid can be conductive. In this way, the grid can be a part of or an extension of the bottom electrode 1030. In one embodiment, the first material is $SiO_2$ and the second material is $TiO_2$. The grid layer 1020 scatters the trapped waveguided modes from the organic layers. The metal mirror 1015 is positioned at a distance at least 100 nm from the organic emissive layer 1040 to prevent or inhibit excitation of SPPs. In some embodiments the metal mirror 1015 is positioned at a distance greater than 100 nm from the organic emissive layer 1040. Inventors believe that the provision of the combination of the sub-electrode grid and the metal mirror in a TEOLED stack according to the present disclosure is able to extract substantial amount of waveguide mode efficiently. The TEOLED stack 1000 can include a spacer layer 1025 whose thickness can be varied for tuning the cavity effects. The spacer layer thickness is one parameter that can be used to tune the cavity resonant frequency based on the emitter color. This adds one more degree of freedom to enhance the efficiency.

As shown in FIG. 10B, the grid layer 1020 is formed of two transparent materials having different refractive indices where one material forms a grid structure within (or embedded in) the second material as the host. The refractive index of the host material and the embedded grid can be varied independently. Moreover, all of the geometric parameters of the grid (width, periodicity, height, and shape) can be varied. The thickness and refractive index of the grid layer can be used to tune the optical field (i.e. shape and distribution of the waveguide modes) within the OLED, while the parameters of the grid are optimized for maximum scattering of light from the waveguide.

Figure 11A:
FIG. 11A shows the outcoupling efficiency vs. bottom ITO thickness.
Figure 11B:
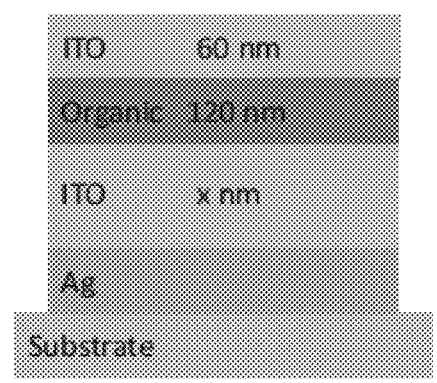
FIG. 11B shows the structure simulated using COMSOL simulation software.

Referring to FIGS. 11A and 11B, inventors calculated the outcoupling efficiency vs. bottom ITO thickness for a control TEOLED device (i.e, with a Ag mirror layer but without the grid layer) shown in FIG. 11B by varying the bottom ITO thickness and using a COMSOL simulation software. The plot in FIG. 11A shows that without introducing the grid layer, the OLED achieved the maximum outcoupling efficiency of 25% with ITO of 180 nm thick.

Figure 12A:
FIG. 12A shows the dependence of outcoupling efficiency on grid layer thickness.
Figure 12B:
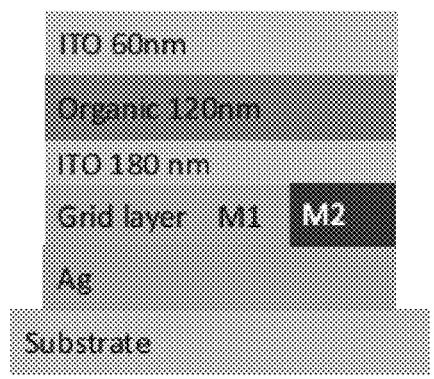
FIG. 12B shows the device structure.

Based on that information, inventors formulated a TEOLD structure shown in FIG. 12B including the grid layer according to the present disclosure. The device was configured with the optimal bottom ITO thickness of 180 nm. The grid layer consisted of two transparent dielectric materials M1 and M2 which were $SiO_2$ and $TiO_2$, respectively. The plot of the outcoupling efficiency as a function of the grid layer thickness in FIG. 12A shows the dependence of outcoupling efficiency on the grid layer thickness. As shown, with the exception of the three data points at grid thickness of 100 nm, 160 nm, and 180 nm, the inventive TEOLED exhibited outcoupling efficiency exceeding 25% which was the maximum outcoupling efficiency exhibited by the control device of FIG. 11B. This confirmed the beneficial effects of providing the combination of a mirror layer and a grid layer below the bottom transparent electrode in a TEOLED.

Figure 13A:
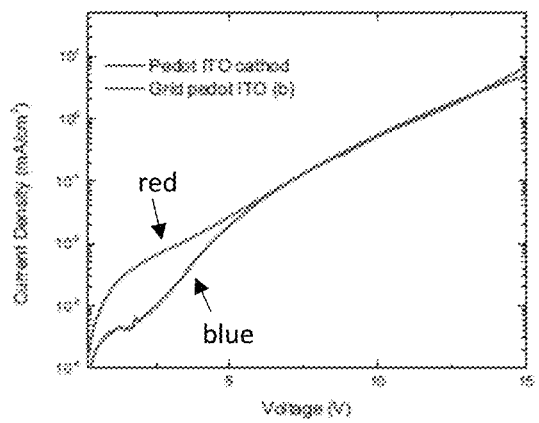
FIG. 13A shows the electrical characteristics of the two devices.
Figure 13B:
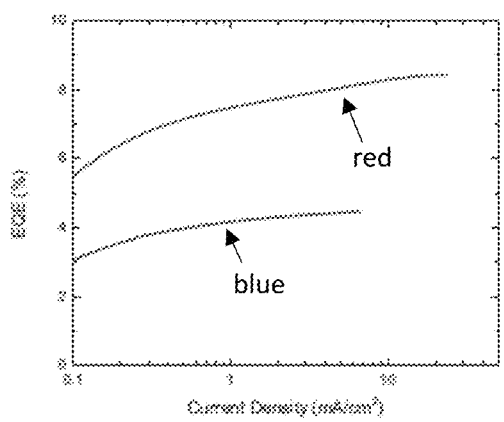
FIG. 13B is a plot of the EQE for the two devices.
Figure 13C:
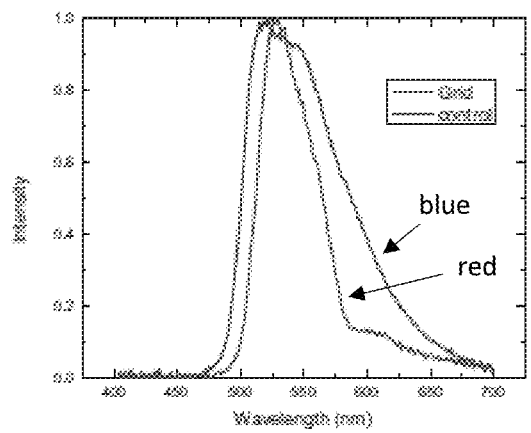
FIG. 13C shows the spectra of the devices. The blue line is the control device and the red line is the grid.
Figure 13D:
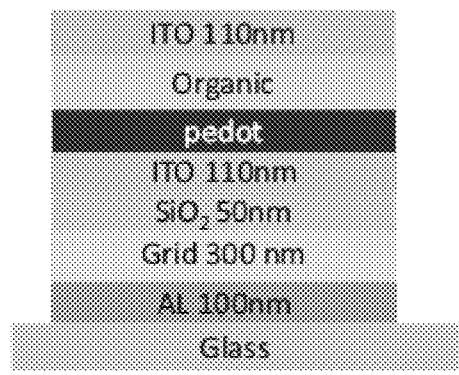
FIGS. 13 A, 13B, and 13C show the experimental data of a device architecture shown in FIG. 13D which incorporates the grid structure and a control device. PEDOT:PSS thickness is 100 nm. Organic layer from substrate side: 40 nm TAPC/30 nm CBP:Ir(ppy)3/60 nm Bphen/10 nm BPhen doped with lithium. The control device has the same structure as FIG. 13D but without the grid layer.

FIGS. 13A-13C show the experimental data of a TEOLED architecture shown in FIG. 13D which incorporates the sub-electrode grid and Al mirror layer and a control device. The spacer layer between the grid layer and the bottom transparent electrode (ITO) was 50 nm of $SiO_2$. The 100 nm PEDOT layer provided in this example is a hole injection layer. Organic emissive layer was structured as follows (listing from the substrate side): 40 nm TAPC/30 nm CBP:Ir(ppy)3/60 nm Bphen/10 nm BPhen doped with lithium. The control device was configured to have the same structure as FIG. 13D but without the grid layer. FIG. 13A shows the electrical characteristics of the two devices. FIG. 13B is a plot of the EQE for the two devices. FIG. 13C shows the spectra of the devices. The blue line is the control device and the red line is the grid.

Figure 14A:
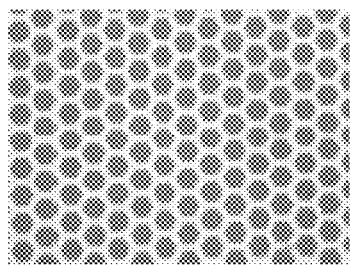
FIGS. 14A, 14B, and 14C illustrate other possible geometry for the sub-anode grid.
Figure 14B:
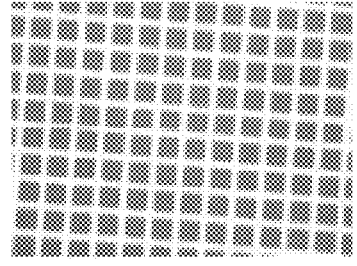
Figure 14C:
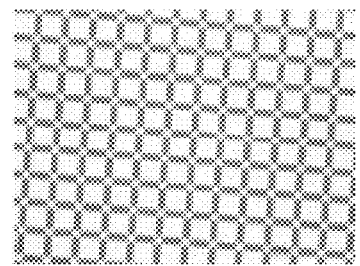

In some embodiments, the pattern of the grid in the grid layer comprises a plurality of space-filling polyhedra substantially aligned in rows and columns. In one embodiment, sides of the space-filling polyhedra have a step height of less than 10 nm. In one embodiment, sides of the space-filling polyhedral have a step height of less than 8 nm. In some embodiments, the space-filling polyhedra are substantially one of square, triangular, or hexagonal. In other embodiments, as shown in FIGS. 14A-14C, the grid structure in the grid layer 1020 can be in the form of a variety of geometry. For example, as shown in FIG. 14A, the grid lines can be in the form of a polygon, such as a hexagon.

The fabrication of the grid layer 1020 can be performed in a variety of conventional ways including lithography followed by etching and planarization of the substrate or host material; nanoimprint patterning of the grid followed by planarization; or pattering of a void grid followed by lamination of a thin planar overlayer. Subsequent transparent electrode (ITO) deposition and OLED fabrication can be done using known conventional means.

Another embodiment of TEOLED with a configuration to enhance light extraction is described below. The TEOLED comprises a transparent conductive oxide on the surface of a nondiffractive, reflecting metal-coated scattering grid located beneath the organic active region. The grid scatters light trapped in waveguide modes without changing the device electrical properties or causing significant plasmonic losses. This results in an increase in EQE for green PHOLED devices from 20±1% to 30±2%, for structures without and with the reflecting grid. Adding a low refractive index capping layer reduces the spectral angular dependence characteristic of TEOLEDs. The improvement in light extraction by substrate modification allows for optimization of the optical design without necessitating changes in the design or structure of the OLEDs themselves.

Unlike bottom-emitting OLEDs, TEOLEDs emit through a semitransparent electrode into air and do not suffer from optical power trapping within the substrate. However, the higher reflectivity of the semitransparent top electrode creates a strong optical cavity that introduces additional lossy waveguide modes along with undesirable angle and wavelength dependences of the emission spectrum. Furthermore, since both electrodes in top-emitting devices are often composed of metal, it is not possible to entirely suppress SPP modes using thick organic layers without also lowering efficiency.

In one instance, an outcoupling scheme for TEOLEDs can include replacing both anode and cathode with indium zinc oxide (IZO)/molybdenum trioxide (MoO3) transparent contacts and placing a reflective and scattering corrugated metal-coated dielectric mirror beneath the electrically active organic emissive region (EML). This is combined with a low refractive index antireflection (AR) layer to reduce microcavity effects.

Figure 15:
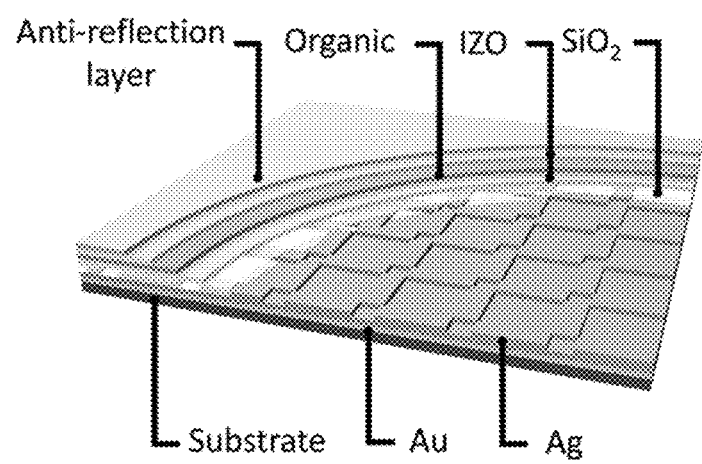
FIG. 15 shows a schematic cut away view of TEOLED with indium zinc oxide (IZO)/MoO3 electrodes and a metal-coated subelectrode grid. The low refractive index antireflection layer reduces microcavity effects. The Au layer bonds the subelectrode grid to the substrate.

A schematic diagram of the device is shown in FIG. 15. The design spaces the active organic emissive region away from the metal reflector (Ag) to minimize coupling to SPP modes while scattering out the waveguided optical power without disturbing the planarity of the device itself. Employing a scattering structure within the substrate while retaining a planar substrate surface allows complete freedom for optimizing the scattering layer dimensions without affecting the electrical properties of the OLED. The Ag reflector is a patterned grid of raised rectangles whose periodicity is on the order of several wavelengths to avoid angle- and wavelength-dependent effects. A dielectric spacer ($SiO_2$) fills in the depressions between the Ag patterned grid and extends above the rectangular grid, providing a planar surface for the subsequent deposition of the electrodes and organic layers. The thick and thin spacer regions couple differently to the microcavity modes by locally creating both thick and thin cavity regions beneath the electrode.

Figure 16A:
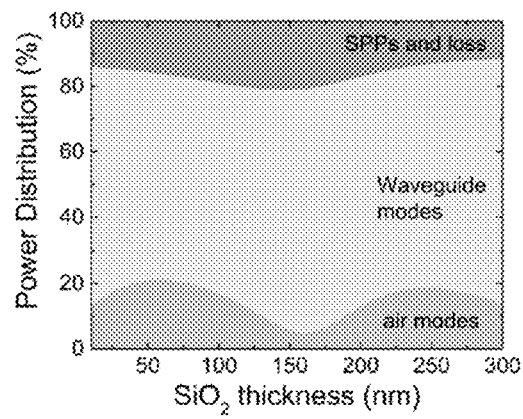
FIG. 16A is a plot of the modal power distribution vs. spacer layer thickness. The refractive index of the spacer is 1.5.

To optimize the light extraction from the two cavity regions, the effects of the spacer ($SiO_2$) thickness are determined using Green's function analysis, as shown in FIG. 16A. FIG. 16A shows the modal power distribution vs. spacer layer thickness. The refractive index of the spacer is 1.5. The EML region used in simulating this structure comprises a 130-nm-thick organic layer (norg, (the refractive index of the organic layer)=1.8) sandwiched between 80-nm-thick transparent electrodes (50 nm IZO and 30 nm $MoO_3$, the refractive indices nIZO and $nMoO_3$ are=2), with the emission layer (EML) placed 60 nm above the bottom electrode. A randomly oriented green-emitting molecular dipole is placed at the position of the EML. The spacer refractive index is n=1.5. The optical outcoupling efficiency is >20% when spacer layer thicknesses are 65 and 245 nm. Most of the optical power is lost into waveguide modes due to the elimination of SPPs, as shown in FIG. 16A.

SPP coupling in the thick and thin cavity regions are determined by calculating the local electric field of the plasmon mode at the EML, E(z). The emission rate into the SPP mode is found using Fermi's golden rule:

$$\Gamma(\omega) = \frac{2\pi}{\hbar} |\langle i | d \, E(z) | f \rangle|^2 \rho(\hbar\omega) \quad (1)$$

where d denotes the exciton dipole moment, i and f the initial and final exciton state wave functions, and $\rho(\hbar\omega)$ the plasmonic mode density. The distance of the exciton from the metal interface is z, and E(z) is the electrical field of the SPP mode normalized to a half-quantum for zero-point fluctuations. The magnetic field intensity profiles of SPP modes in the OLED cavities are shown in FIGS. 16B and 16C, found using the dispersion relation $$k_{SPP}^2 = \frac{\varepsilon_m \varepsilon_d}{\varepsilon_m + \varepsilon_d} \left(\frac{2\pi}{\lambda}\right)^2 \quad (2)$$

where wavelength λ=510 nm. Since the skin depths of the modes are comparable or even smaller than the dielectric thickness, we assume a semi-infinite metal layer having a dielectric constant $\varepsilon_m$ in contact with a semi-infinite dielectric layer with dielectric constant $\varepsilon_d$.

Figure 16B:
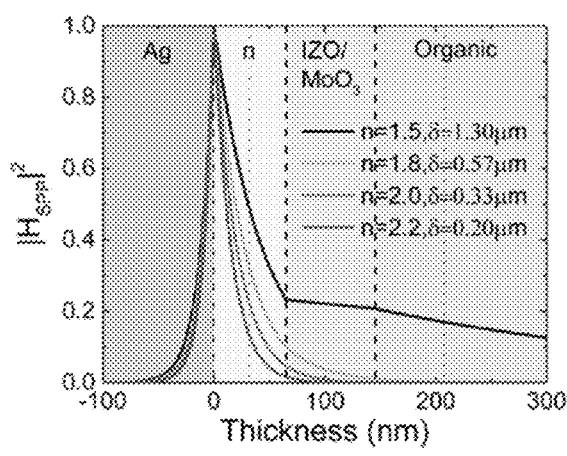
FIG. 16B shows SPP magnetic field intensity across the control device structure with different refractive indexes, n. Also shown is the SPP mode propagation length, δ. The structure is Ag/656 nm dielectric with variable n/60 nm IZO and MnO$_3$/organic layers (grid line area of the metal-coated grid). Emission layer position is denoted by the red dotted line.
Figure 16C:
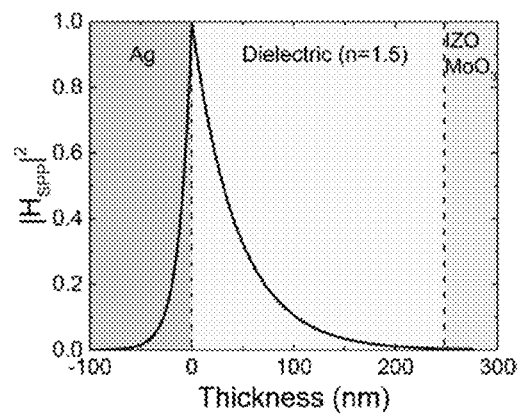
FIG. 16C shows field intensity over deeper grid region, with dielectric layer thickness of 245 nm and n=1.5 (depression area of the metal-coated grid).

FIG. 16B shows the calculated mode profiles in the regions where the cavity is thin (corresponding to the areas where the grid lines are raised) for different values of the index of refraction of the spacer layer, n. The calculated propagation lengths of SPP modes ($\delta_{SPP}=1/[2Im(k_{SPP})]$) are also shown. Both the field intensity in the EML whose position is denoted by the black dotted line and the propagation length decrease as the refractive index of the spacer layer increases. For comparison, the red dotted line indicates the distance from the EML to the metal in a conventional TEOLED. In that case, the local field of the SPP mode in the EML is larger than in our design (black dotted line), leading to a faster exciton coupling rate to SPPs. In FIG. 16C, we observed that the SPP decays before reaching the organic layers in a thick cavity with n=1.5. The coupling to SPP modes decays exponentially as the distance increases between the EML and the metal surface. Thus, SPP coupling can be avoided with nonmetallic electrodes and the appropriate choice of spacer material and thickness.

The simulated modal power distributions of the cavities using Green's function analysis are shown in FIGS. 17A and 17B. We define u as the ratio of the in-plane component of the wavevector, $k_{\parallel}$, for light propagating in the organic layer with a refractive index of $n_{org}$, to the total wavevector k, i.e., $u=k_{\parallel}/k$.

Thus, the region at u>1 corresponds to evanescent waves in the near field. Usually, modes with $u<n_{air}/n_{org}$ are radiative, those with $n_{air}/n_{org}<u<1$ are waveguided, and modes in the region u>1 are SPPs. For the thin cavity, there are four waveguide modes in the emission spectrum and a weak SPP mode. The thick cavity adds three more waveguide modes but has no SPP modes. FIG. 18C shows the power distribution of a conventional TEOLED optimized over the same spectral range, with the structure Ag/90 nm organic layers/20-nm-thick top Ag layer, with a 20-nm-thick EML centered in the organic active region. This structure does not support waveguide modes, but has two SPP modes. The first SPP mode at u≈0.6 and λ≈540 nm is supported by the top thin Ag film. According to equation (2) and given $n_{air}<n_{org}$, this SPP mode lies in the region of u<1 rather than u>1 for organic/metal SPPs. The second SPP mode supported by the Ag/organic interface lies at u>1.5. FIGS. 17A-17C show that, compared to conventional devices, both the control and metal-coated grid devices successfully suppress SPP modes while coupling more power into the waveguide modes.

The scattering by the grid is a consequence of the mismatch between the waveguide modes supported by the two cavity regions (thick and thin) above the grid lines and depressions, which can be estimated by the overlap of the wavevectors of these modes. The TE1 and TM1 modes in the thin SiO2 cavity (FIG. 17A) have some overlap with the TE1 and TM1 modes in the thick cavity (FIG. 17B), and thus these modes are inefficiently scattered. The modes that are not aligned between cavities are scattered by the grid. The spacer thicknesses determine the mismatch of the modes, but freedom to optimize the spacer thickness is limited when matching the cavity resonance to the OLED emission spectrum.

Figure 18A:
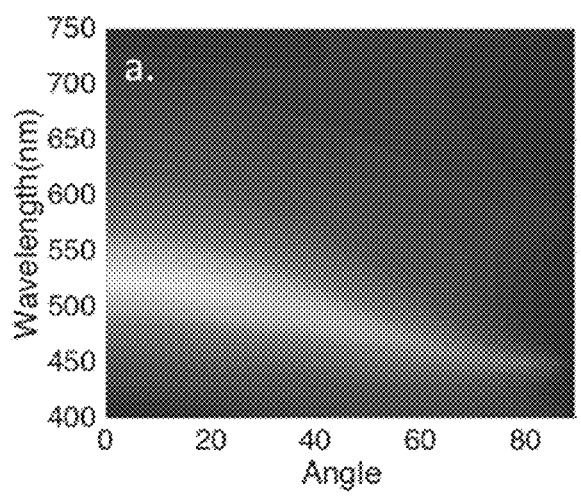
FIG. 18A is a color map of the simulated angle and wavelength dependence of the control device without a 70-nm-thick low-refractive (n=1.37) antireflection (AR) coating.
Figure 18B:
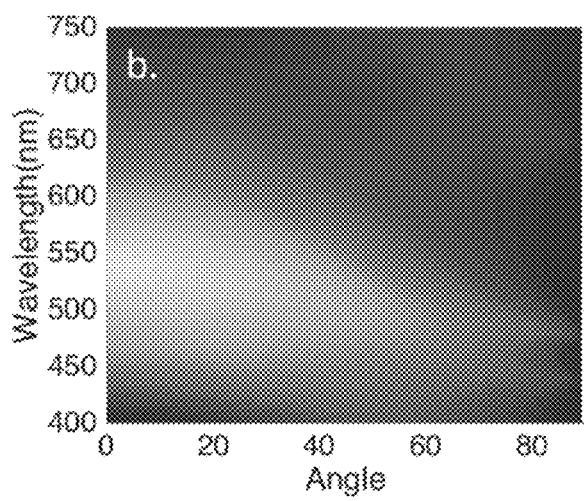
FIG. 18B is a color map of the simulated angle and wavelength dependence of the control device with a 70-nm-thick low-refractive (n=1.37) antireflection (AR) coating.

FIG. 18A is a color map of the simulated angle and wavelength dependence of the control device without a 70-nm-thick low-refractive (n=1.37) antireflection (AR) coating. FIG. 18B is a color map of the simulated angle and wavelength dependence of the control device with a 70-nm-thick low-refractive (n=1.37) antireflection (AR) coating. The device with the AR coating shows a broader spectrum and smaller blue shift at larger angles. The simulated output of a dipole in the thin SiO2 cavity regions using Green's function analysis, shown in FIG. 18A is strongly angle dependent. The spectral peak wavelength ranges from λ=545 nm normal to the plane (0°) to λ=460 nm at 90°. A 70-nm-thick low-refractive AR layer between air and the top IZO electrode reduces the cavity effects, as is apparent by the spread in wavelength emission and reduced blue shift with angle in FIG. 18B. An example AR coating material is MgF$_2$, whose refractive index is nMgF$_2$=1.38 in the range of the emission spectrum, close to the optimized value of n=1.4 for IZO/air interfaces.

EXPERIMENT

An OLED was fabricated using IZO/MoO3 electrodes as the control and another OLED was fabricated with a disclosed metal-coated grid, each device having the same active layer according to the present disclosure. The active layers in the devices were as follows starting from the substrate: 50 nm IZO/30 nm MoO3/30 nm 4,7-diphenyl-1,10-phenanthroline (BPhen):Li(molar 1:1)/30 nm BPhen/30 nm Ir(ppy)$_3$ doped at 8 vol. % in 4,4'-bis(carbazol-9-yl)biphenyl (CBP)/40 nm 4,4'-cyclohexylidenebis[N,N-bis(4-methylphenyl) benzenamine] (TAPC)/30 nm MoO$_3$/50 nm IZO. The bottom MoO$_3$ layer reduces electrical shorts that penetrate the spacer layer created by protrusions left behind from the grid lithography process. The top MoO$_3$ layer prevents damage to the organic active region during the IZO sputtering process (discussed below).

The control device was made with a 150 nm thick, planar Ag layer covered with a 65 nm SiO$_2$ spacer layer beneath the active region. The grid reflector is an array of 1×3 μm raised rectangles surrounding 3×3 μm and 1×1 μm square depressions, with the spacer thicknesses given above. Both devices are capped with a 70 nm thick MgF$_2$ AR coating.

Figure 19A:
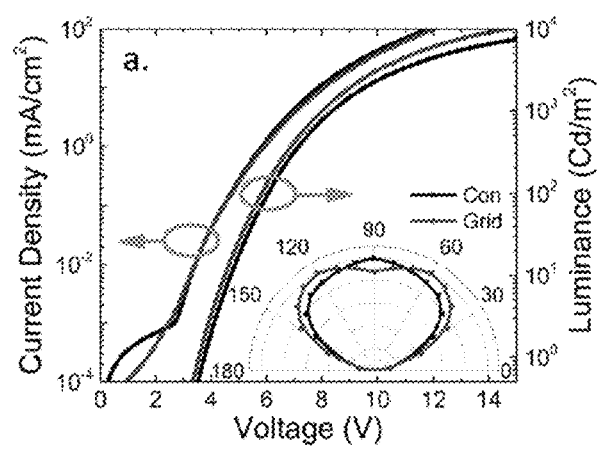
FIG. 19A is a plot of current density-voltage characteristics and (inset) the angular intensity profiles of the control (black) and metal-coated grid (red) devices.
Figure 19B:
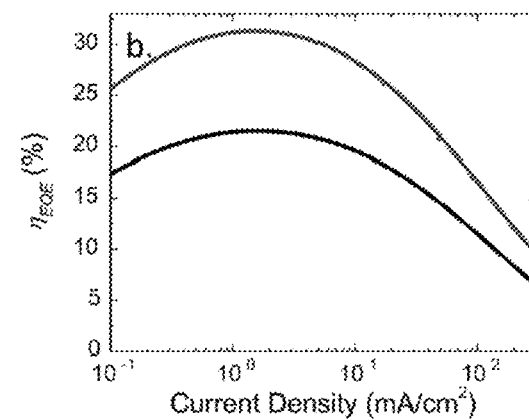
FIG. 19B is a plot of EQE of the control and metal-coated grid devices.

The current density-voltage curves of both devices are identical above turn on (~3 V), as shown in FIG. 19A. Furthermore, $\eta_{EQE}$ is increased from 20±1% to 30±2% using the metallic scattering grid, as shown in FIG. 19B.

Figure 19C:
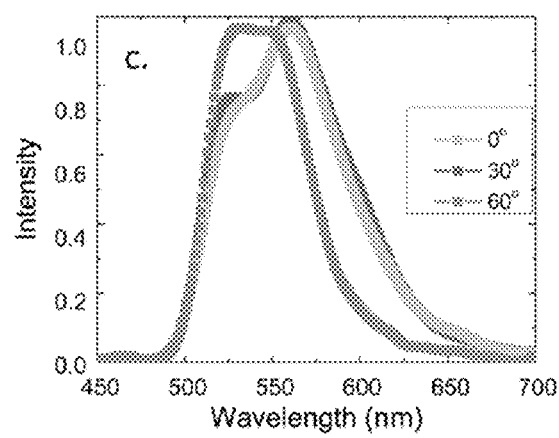
FIG. 19C shows the emission spectra of the control device with a MgF$_2$ AR coating at 0°, 30°, and 60° with 2° error.
Figure 19D:
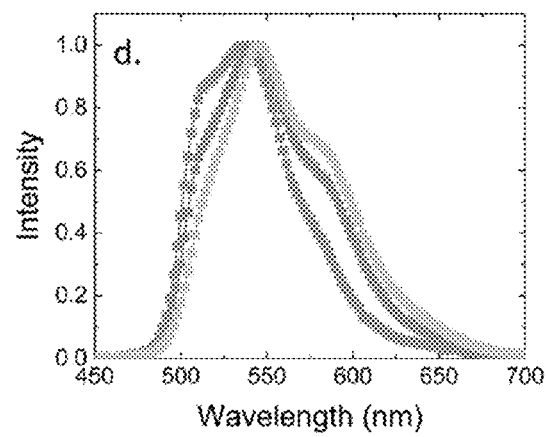
FIG. 19D shows the emission spectra of the metal-coated grid device with a MgF$_2$ AR coating at 0°, 30°, and 60° with 2° error.

The angular intensity profiles of the devices with the AR layer are broadened from a simple Lambertian emission profile. The peak intensity of the control device is normal to the surface, whereas the grid OLED intensity is at a maximum at 20° from normal. The spectra of the control (FIG. 19C) and the metal-coated grid (FIG. 19D) OLEDs are shown at 0°, 30°, and 60°. Both devices have spectral peaks at λ≈550 nm. Compared with the control, the grid device shows a slightly increased blue shift at large angles.

The emission intensity is a function of the overlap between the cavity resonance and the emission spectrum. The microcavity resonance peak (at λ≈540 nm, see FIGS. 18A and 18B) is red-shifted from the emission spectral peak (λ≈510 nm). Thus, the blue shift with angle results in broader than the Lambertian angular intensity profiles for the control and grid devices shown in FIG. 18A, inset. The broadening of the grid OLED spectrum is more severe because the capping layer thickness, which reduces the cavity quality, was optimized for the thin cavity region of the grid devices, which is the same as the spacer layer thickness used in the control device.

Although a significant enhancement in efficiency is obtained using the reflecting grid, 60% of the optical power is still lost in the device. In addition to the limited grid scattering efficiency due to the spacer thickness used, the scattered light incurs losses at each reflection from the metal surface. A diffuser film or microlens array comprised of high refractive index materials added to the top surface of the control devices should also generate higher efficiencies by reducing the cavity quality factor. The weaker cavity produced by these strategies is also beneficial for outcoupling white light. Using the fact that a microlens array foil extracts more than half of the optical power going into the foil, the Green's function analysis shows that a microlens array on the device emitting surface could further improve the efficiency by at least 30%.

In summary, a TEOLED with IZO/MoO$_3$ electrodes has achieved $\eta_{EQE}$=20±1%, with almost no excitation of SPP modes. The efficiency is increased to 30±2% by using a metal-coated scattering grid layer beneath the anode without impacting the OLED electrical characteristics. The efficiency can be further improved using a microlens array or diffuser on the device emitting surface. The grid scatters the waveguided power and reduces plasmonic losses. The metallic scattering grid is fabricated within the substrate and hence, is totally separate from the organic active layers, allowing for considerable freedom in both the OLED and grid optical designs. Note that if the insulating spacer layer is replaced with a low-resistance transparent metal oxide, it can be used as conductive layer used for addressing OLED pixels in an active matrix display. This is just one of several possibilities allowed by this subelectrode light-scattering approach.

Figures 20A, 20B, 20C:
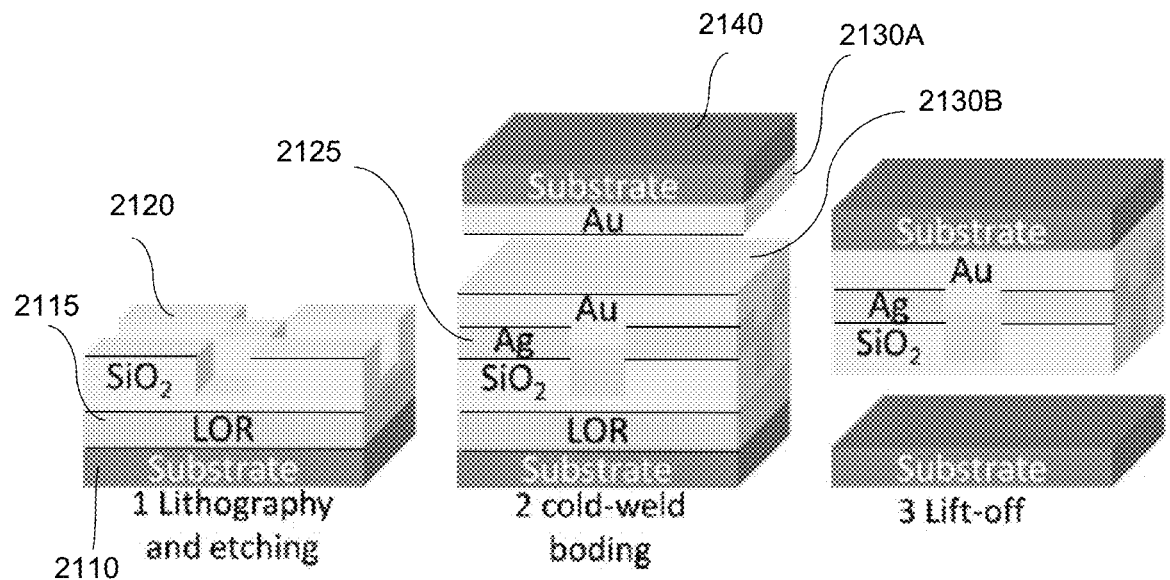
FIG. 20A-20C show the fabrication sequence of the metal-coated grid.
Figure 20D:
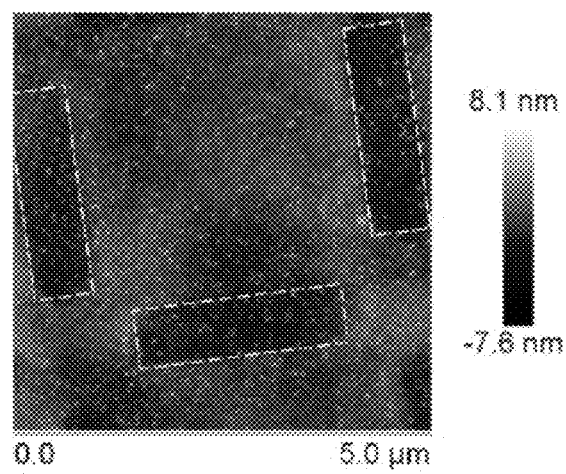
FIG. 20D shows an atomic force microscope image of the grid surface. There is deformation over the grid line area (indicated by dashed lines), and the root-mean-square surface roughness is 1.2 nm. The height difference due to the deformation is <5 nm.

The fabrication sequence for the metallic scattering layer is shown in FIGS. 20A-20C. A 245 nm SiO$_2$ film 2120 was deposited by electron-beam evaporation on a glass substrate 2110 precoated with sacrificial lift-off resist 2115 (MicroChem LOR 10B) (4000 rpm, 180° C.). Photoresist (Microposit S1813) (not shown) was subsequently coated at 4000 rpm and cured at 115° C. for 90 s. The pattern was photolithographically defined using an AutoStep exposure system (GCA AS200) with an exposure time of 0.33 s. The 180 nm deep etch of the SiO$_2$ film 2120 was done using a 1:1 CF$_4$/CHF$_3$ plasma at 100 W. The photoresist was removed by exposure to oxygen plasma for 3 min at 800 W. Referring to FIG. 20B, then a 150 nm thick Ag film 2125 was deposited by thermal evaporation after a 2-nm-thick Ti wetting layer (not shown). Next a 5-nm-thick Ge wetting layer (not shown) followed by a 200-nm-thick Au film 2130A, 2130B was deposited by electron-beam evaporation at 10 Å/s onto the surface of a clean glass 2140 and Ag/SiO$_2$/glass substrate, respectively. The two glass substrates were then sealed together via cold-weld bonding by applying heat (200° C.) and pressure (4 MPa) for 5 min under vacuum (10-3 Torr) using an EVG 510 wafer bonder. The bonding is sufficiently robust to survive sonication, although the Au surface on the grid is irregular due to the SiO$_2$ trenches, leaving vacancies at the bonding interface. The bonded glass slabs are diced into 1×1 in. squares, which were soaked in Remover PG (MicroChem at 80° C.) to dissolve the sacrificial LOR layer to leave the metallic-coated grid. After the grid preparation, a 50 nm thick IZO layer was deposited at 60 W in a chamber with an Ar pressure of 2 mTorr at a rate of 0.6 Å/s using a radio frequency magnetron sputterer.

The control substrate was prepared as follows: A glass substrate was cleaned using sonication in tergitol, deionized water, acetone, and isopropyl alcohol (IPA). A 2-nm-thick Ti wetting layer and 150-nm-thick Ag layer were sequentially deposited by thermal evaporation, followed by a 65-nm-thick SiO$_2$ film by electron-beam evaporation and 50-nm-thick IZO by sputtering (23 ohm/sq). The area was defined by a shadow mask without breaking vacuum between depositions.

The IZO-coated substrates were cleaned for 3 min by sonication in IPA and exposed to ultraviolet-ozone before PHOLED layer deposition by vacuum thermal evaporation in a system with a base pressure of 10-7 Torr. The first MoO$_3$ layer was deposited at 0.5 Å/s and the top MoO$_3$ layer at 0.05 Å/s for the first 5 nm and at 0.2 Å/s for the remaining thickness in the same chamber as the organic layers. The top IZO electrode was sputter-deposited in a chamber with an Ar pressure of 5 mTorr at 0.05 Ads for the first 10 nm and 2 mTorr at 0.2 Å/s for the remaining thickness. Finally, the MgF$_2$ capping layer was thermally deposited. The refractive indices and thicknesses of materials were measured using a variable-angle spectroscopic ellipsometer (J. A. Woollam WVASE32). Current-voltage-luminance characteristics were collected using a semiconductor parameter analyzer (HP-4156A) and a calibrated Si photodiode. The electroluminescence spectra were measured using an Ocean Optics miniature spectrometer. The $\eta_{EQE}$ was calculated using standard methods.

In the various embodiments of enhancing outcoupling and inhibiting SPPs disclosed herein, preferably an optical diffuser structure is provided at the glass substrate-air interface to achieve wavelength independence and to extract light from the glass mode. For example, microlens array can be provided at the glass substrate-air interface. Since the microlens surface angles vary for different incident positions, the refracted output angles are also different, making these arrays effective diffusers. Another example of a diffuser is a nanoscale scattering layer consisting of a transparent polymer film with a suspension of ~100 nm diameter, high index TiO$_2$ nanoparticles. Because of the difference in the refractive index, the nanoparticles scatter the incident photons into random angles.

In some embodiments, the OLED incorporating the novel structures disclosed herein has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A organic light emitting device (OLED), comprising:
   a transparent substrate having a first side and a second side;
   an emissive region disposed over the first side of the transparent substrate, the emissive region comprising:
      a transparent first electrode disposed over the transparent substrate;
      at least one organic emissive layer disposed over the transparent first electrode; and
      a transparent second electrode disposed over the at least one organic emissive layer;
   an organic layer disposed over the second electrode layer;
   a metal optical grating layer disposed on the organic layer, wherein the metal optical grating layer having a grating structure having a sub-wavelength periodicity disposed on the transparent second electrode; and
   a reflective layer disposed over the metal optical grating layer.

2. The OLED of claim 1, wherein the metal optical grating structure layer has a feature size of 300 nm and a thickness of no more than 10 nm.

3. The OLED of claim 1, further comprising an optical diffuser layer provided on the second side of the transparent substrate.

4. The OLED of claim 3, wherein the optical diffuser layer comprises a microlens array or a nanoparticle diffuser.

5. The OLED of claim 1, wherein the emissive region further comprises an electron transport layer having a thickness of at least 50 nm disposed between the cathode and the at least one organic emissive layer.

6. The OLED of claim 1, wherein the metal optical grating layer is Al or Ag.

7. The OLED of claim 1, wherein the reflective layer is disposed on the metal optical grating layer.

* * * * *